(12) United States Patent
Baek et al.

(10) Patent No.: US 9,650,238 B2
(45) Date of Patent: May 16, 2017

(54) VIBRATION DEVICE INCLUDING SUPPORT PORTION

(71) Applicant: Electronics and Telecommunications Research Institute, Daejeon (KR)

(72) Inventors: In Bok Baek, Daejeon (KR); Han Young Yu, Daejeon (KR); Yark Yeon Kim, Daejeon (KR); Young Jun Kim, Daejeon (KR); Chang Geun Ahn, Daejeon (KR); Yong Sun Yoon, Daejeon (KR); Bong Kuk Lee, Daejeon (KR); Ji Eun Lim, Daejeon (KR); Won Ick Jang, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 14 days.

(21) Appl. No.: 14/475,487

(22) Filed: Sep. 2, 2014

(65) Prior Publication Data

US 2015/0061455 A1    Mar. 5, 2015

(30) Foreign Application Priority Data

Sep. 3, 2013   (KR) .................... 10-2013-0105708
Jul. 30, 2014  (KR) .................... 10-2014-0097114

(51) Int. Cl.
*B81B 7/02* (2006.01)
*B81C 1/00* (2006.01)
*B81B 7/00* (2006.01)
*H03H 3/007* (2006.01)
*H03H 9/08* (2006.01)
(Continued)

(52) U.S. Cl.
CPC .............. *B81B 7/02* (2013.01); *B81B 7/0006* (2013.01); *B81B 7/0093* (2013.01); *B81C 1/0019* (2013.01); *B81C 1/0038* (2013.01); *B81C 1/00142* (2013.01); *B81C 1/00539* (2013.01); *H03H 3/0072* (2013.01); *H03H 9/08* (2013.01); *H03H 9/2463* (2013.01);
(Continued)

(58) Field of Classification Search
CPC ....... B81B 7/0006; B81B 7/0093; B81B 7/02; B81C 1/0019; B81C 1/0038; B81C 1/00539; F03G 7/005; H02N 11/002; H03H 2009/02291; H03H 9/08; H03H 9/2463
USPC ...................... 310/300, 309, 310; 216/41, 95
See application file for complete search history.

(56) References Cited

U.S. PATENT DOCUMENTS

2007/0165096 A1* 7/2007 Nakamura ......... G02B 26/0833
                                                    347/225
2009/0184781 A1  7/2009 Ni
(Continued)

FOREIGN PATENT DOCUMENTS

DE         44 44 149 A1   6/1995

*Primary Examiner* — Terrance Kenerly
*Assistant Examiner* — Rashad Johnson

(57) ABSTRACT

A vibration device including a supporting portion formed to cover both ends of a vibration region, and a method of manufacturing the vibration device are provided. The vibration device may include a lower substrate on which an insulating layer is formed, an upper substrate connected onto the insulating layer, and including a vibration region that vibrates and that is separated from the lower substrate by at least a predetermined distance, and a supporting portion formed to cover both ends of the vibration region, to support the vibration region.

16 Claims, 10 Drawing Sheets

(51) Int. Cl.
*H03H 9/24* (2006.01)
*H02N 11/00* (2006.01)

(52) U.S. Cl.
CPC ............... *B81B 2201/0271* (2013.01); *B81B 2203/0109* (2013.01); *B81B 2203/0307* (2013.01); *H02N 11/002* (2013.01)

(56) References Cited

U.S. PATENT DOCUMENTS

| | | | |
|---|---|---|---|
| 2009/0267706 A1* | 10/2009 | Park | B81C 1/00142 333/186 |
| 2010/0270530 A1* | 10/2010 | Park | B82Y 10/00 257/9 |
| 2011/0193052 A1* | 8/2011 | Yu | B82Y 10/00 257/9 |
| 2012/0091547 A1* | 4/2012 | Kamiyama | B81C 1/00142 257/418 |
| 2012/0200366 A1* | 8/2012 | Nishiyama | H03H 9/13 331/158 |
| 2012/0217479 A1* | 8/2012 | Chang | B82Y 10/00 257/24 |
| 2012/0236383 A1 | 9/2012 | Mizoguchi | |
| 2014/0021443 A1* | 1/2014 | Yu | B81C 1/00134 257/24 |
| 2014/0125431 A1* | 5/2014 | Bhattacharjee | H03H 9/02275 333/186 |
| 2014/0152143 A1* | 6/2014 | Rogers | B81C 1/00182 310/309 |

* cited by examiner

VIBRATION DEVICE INCLUDING SUPPORT PORTION

CROSS-REFERENCE TO RELATED APPLICATIONS

This application claims the benefit of Korean Patent Application No. 10-2013-0105708 and of Korean Patent Application No. 10-2014-0097114, respectively filed on Sep. 3, 2013 and Jul. 30, 2014, in the Korean Intellectual Property Office, the disclosures of which are incorporated herein by reference.

BACKGROUND

1. Field of the Invention

The present invention relates to a vibration device and a method of manufacturing the vibration device, and more particularly, to a vibration device including a supporting portion formed to cover both ends of a vibration region, and a method of manufacturing the vibration device.

2. Description of the Related Art

Micro-Electro-Mechanical Systems (MEMS) have been developed based on semiconductor technologies and fine processing technologies. Recently, MEMSs are receiving attention as a technology applicable to various fields while converging with other technologies.

However, a conventional vibration device manufactured using a MEMS manufacturing technology requires a process of etching an insulating layer between an upper substrate and a lower substrate to separate a vibration region from the lower substrate and to support the vibration region. During the process, a structure of the etched insulating layer may be deformed.

Accordingly, there is a desire for a vibration device in which a structure of an insulating layer is not deformed despite etching being performed for a relatively long period of time, and a method of manufacturing a vibration device to prevent deformation of a structure of an insulating layer when etching is performed for a relatively long period of time.

SUMMARY

An aspect of the present invention provides a method of manufacturing a vibration device that may prevent an insulating layer from being unnecessarily etched during formation of a vibration region.

Another aspect of the present invention provides a vibration device and a method of manufacturing the vibration device that may suppress thermal noise generated by transferring heat generated in an upper substrate and a lower substrate to a vibration region.

According to an aspect of the present invention, there is provided a vibration device, including: a lower substrate on which an insulating layer is formed; an upper substrate connected onto the insulating layer, and including a vibration region that vibrates and that is separated from the lower substrate by at least a predetermined distance; and a supporting portion formed to cover both ends of the vibration region, to support the vibration region.

The supporting portion may be formed of a material determined based on a material forming the upper substrate and a material forming the insulating layer.

When a material forming the supporting portion is identical to a material forming the upper substrate, a protection material used to protect the upper substrate from etching may be applied onto the upper substrate.

Radiation fins may be formed on the supporting portion, and may radiate heat generated in the upper substrate and the lower substrate.

The vibration device may further include a lower electrode formed on the top or the bottom of the lower substrate, to output a signal to the vibration region, and an upper electrode formed on the upper substrate, to output a signal to the vibration region.

The lower substrate may include a circuit connected from the lower electrode to the vibration region, and the upper electrode may be connected to the circuit through the supporting portion.

According to another aspect of the present invention, there is provided a vibration device including: a lower substrate on which an insulating layer is formed; an upper substrate connected onto the insulating layer, and including a vibration region that vibrates and that is separated from the lower substrate by at least a predetermined distance; a supporting portion formed to cover both ends of the vibration region, to support the vibration region; and radiation fins formed on the supporting portion, to radiate heat generated in the upper substrate and the lower substrate.

According to another aspect of the present invention, there is provided a vibration device including: a lower substrate on which an insulating layer is formed; an upper substrate connected onto the insulating layer, and including a vibration region that vibrates and that is separated from the lower substrate by at least a predetermined distance; a supporting portion formed to cover both ends of the vibration region, to support the vibration region; and electrodes formed above the vibration region and on the supporting portion, to output a signal to the vibration region.

The vibration region may vibrate in response to an alternating current (AC) signal output from the electrodes, and may output a vibration signal having a resonant frequency.

According to another aspect of the present invention, there is provided a method of manufacturing a vibration device, the method including: forming an insulating layer on a lower substrate, and connecting an upper substrate onto the insulating layer; etching the insulating layer and the upper substrate based on a width and a length of a vibration region; forming a supporting portion to cover both ends of the vibration region; and etching a portion of the insulating layer and forming the vibration region to be separated from the lower substrate by at least a predetermined distance.

Effect

According to embodiments of the present invention, it is possible to prevent an insulating layer from being unnecessarily etched during formation of a vibration region, by forming a supporting portion using a material having a selectivity different from a selectivity of a material forming the insulating layer, to cover both ends of the vibration region.

Additionally, according to embodiments of the present invention, it is possible to minimize torsion of a vibration device caused by vibration of a vibration region, by increasing physical fixing force of the vibration region by forming a supporting portion to cover both ends of the vibration region.

Furthermore, according to embodiments of the present invention, it is possible to suppress thermal noise generated by transferring heat generated in an upper substrate and a lower substrate to a vibration region, by radiating the heat using radiation fins.

BRIEF DESCRIPTION OF THE DRAWINGS

These and/or other aspects, features, and advantages of the invention will become apparent and more readily appreciated from the following description of exemplary embodiments, taken in conjunction with the accompanying drawings of which.

DETAILED DESCRIPTION

Figure 1:
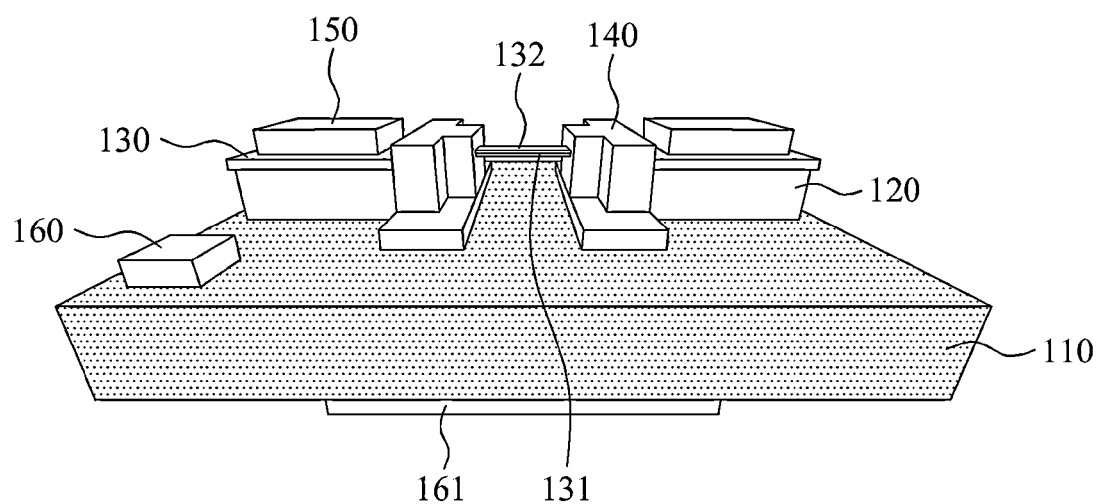
FIG. 1 is a diagram illustrating an example of a vibration device according to an embodiment of the present invention.

Reference will now be made in detail to exemplary embodiments of the present invention, examples of which are illustrated in the accompanying drawings, wherein like reference numerals refer to the like elements throughout. Exemplary embodiments are described below to explain the present invention by referring to the figures.

FIG. 1 is a diagram illustrating an example of a vibration device according to an embodiment of the present invention.

The vibration device of FIG. 1 may include a lower substrate 110, an insulating layer 120, an upper substrate 130, a supporting portion 140, an upper electrode 150, a first lower electrode 160, and a second lower electrode 161.

The insulating layer 120 may be formed on the lower substrate 110. The insulating layer 120 may be formed of an insulating material, and may electrically separate the lower substrate 110 from the upper substrate 130.

The upper substrate 130 may be connected onto the insulating layer 120. Additionally, the upper substrate 130 may include a vibration region 131 that is separated from the lower substrate 110 by at least a predetermined distance and that vibrates. A vibration device manufacturing apparatus may etch a portion of the insulating layer 120 connected to the bottom of the vibration region 131, and may allow the vibration region 131 to be separated from the lower substrate 110. The vibration region 131 may vibrate in response to external vibration, or an alternating current (AC) signal output from one of the upper electrode 150, the first lower electrode 160, and the second lower electrode 161. Additionally, a resonant frequency of a vibration signal generated based on the vibration of the vibration region 131 may be determined based on a width W, a length L and a height H of a portion of the vibration region 131 that is not covered by the supporting portion 140.

Additionally, the vibration region 131 may include a sensing region 132. The sensing region 132 may be formed on the vibration region 131, and may be configured to sense an external material having a mass. For example, when the sensing region 132 is connected to an external material having a mass, a mass of the sensing region 132 may increase, and the sensing region 132 may detect the external material. The sensing region 132 formed on the vibration region 131 may include, for example, as a probe, an organic matter, such as a thiol group and an amine group, a silane group, deoxyribonucleic acid (DNA), or an antibody. The DNA or the antibody may be connected to the thiol group, the amine group and the silane group. The external material may be, for example, gas or a biomaterial.

Additionally, the sensing region 132 may be physically or chemically connected to a material adsorbed onto a probe and having a mass. The sensing region 132 may be formed using various schemes, for example, thin film deposition, coating, spotting, and the like.

For example, the sensing region 132 may be formed using at least one of metal, silicon, an oxide, and a crystal. The metal may include, for example, gold, platinum, silver, and the like. The oxide may include, for example, a silicon oxide, a zinc oxide, an aluminum oxide, and a titanium oxide. Additionally, the crystal may include, for example, a silicon crystal, crystals other than oxides, for example titanium, or crystals other than amorphous oxides among oxides.

The supporting portion 140 may be formed to cover both ends of the vibration region 131, and may support the vibration region 131. The supporting portion 140 may cover the vibration region 131, and a region of the upper substrate 130 that is adjacent to the ends of the vibration region 131, and may prevent deformation of the insulating layer 120, the upper substrate 130, and the vibration region 131 during manufacturing of the vibration device. Additionally, by preventing the deformation of the insulating layer 120, the upper substrate 130, and the vibration region 131, the supporting portion 140 may minimize a distortion and loss of a vibration signal generated by the vibration of the vibration region 131. The supporting portion 140 may have, for example, a shape of an anchor.

The supporting portion 140 may be formed of a material determined based on a material forming the upper substrate 130 and a material forming the insulating layer 120. For example, the material forming the supporting portion 140 may be different from the material forming the upper substrate 130 and the material forming the insulating layer 120, and may be determined based on a selectivity of materials used to etch the upper substrate 130, the insulating layer 120, and the supporting portion 140.

For example, when the lower substrate 110 and the upper substrate 130 are formed of silicon, and when the insulating layer 120 is formed of an oxide film, the supporting portion 140 may be formed of a nitride film. In this example, due to a high selectivity of silicon with respect to a phosphoric acid, the silicon may prevent the upper substrate 130 from being etched or deformed during etching of a nitride film applied onto the upper substrate 130 using a phosphoric acid to form the supporting portion 140. Additionally, because each of a nitride film and silicon have a high selectivity with respect to a hydrofluoric acid, the nitride film and silicon may prevent the upper substrate 130 and the supporting portion 140 from being etched or deformed during etching of a portion of the insulating layer 120 that is connected to the bottom of the vibration region 131 using a hydrofluoric acid, to separate the vibration region 131 from the lower substrate 110. When the supporting portion 140 completely covers the ends of the vibration region 131, a side of the insulating layer 120 connected to the bottom of a region of the upper substrate 130 that is adjacent to the ends of the vibration region 131 may also be covered. Accordingly, during etching of a portion of the insulating layer 120 connected to the bottom of the vibration region 131 using the hydrofluoric acid, etching of a portion of the insulating layer 120 connected to the bottom of a region other than the vibration region 131 may also be prevented.

In another example, when the lower substrate 110, the insulating layer 120, and the upper substrate 130 are formed of silicon, an oxide film, and a nitride film, respectively, the supporting portion 140 may be formed of a silicon film. In this example, due to a high selectivity of the nitride film with respect to a silicon etchant, the nitride film may prevent the upper substrate 130 from being etched or deformed during formation of the supporting portion 140.

In still another example, when a material forming the supporting portion 140 is identical to a material forming the upper substrate 130, a protection material may be applied onto the upper substrate 130. In this example, the protection material may be used to protect the upper substrate 130 from etching in formation of the supporting portion 140.

In yet another example, when the insulating layer 120 is formed of an oxide film, and when the lower substrate 110, the upper substrate 130 and the supporting portion 140 are formed of silicon, an etchant used to etch the supporting portion 140 may be likely to etch the upper substrate 130 during generation of the supporting portion 140. To protect the upper substrate 130 from etching in formation of the supporting portion 140, the vibration device manufacturing apparatus may form the supporting portion 140 by applying an oxide film onto the upper substrate 130. In this example, the etchant may not be in contact with the upper substrate 130 due to the oxide film and accordingly, it is possible to prevent the upper substrate 130 from being etched.

The upper electrode 150 may be formed on the upper substrate 130, and may control the vibration of the vibration region 131 by outputting an AC signal to the sensing region 132.

The first lower electrode 160 may be formed on the lower substrate 110, and may control the vibration of the vibration region 131 by outputting an AC signal to the sensing region 132.

The second lower electrode 161 may be formed on the bottom of the lower substrate 110, and may control the vibration of the vibration region 131 by outputting an AC signal to the sensing region 132.

In the vibration device of FIG. 1, different materials may be used to form the vibration region 131 and the supporting portion 140 that covers the ends of the vibration region 131 and accordingly, it is possible to prevent deformation of the upper substrate 130 including the vibration region 131 during formation of the supporting portion 140. Additionally, the supporting portion 140 may be formed to cover the ends of the vibration region 131, using a material having a selectivity that is different from a selectivity of a material forming the insulating layer 120 and accordingly, it is possible to prevent the insulating layer 120 from being unnecessarily etched during formation of the vibration region 131. Furthermore, physical fixing force of the vibration region 131 may be increased by forming the supporting portion 140 to cover the ends of the vibration region 131 and accordingly, it is possible to minimize torsion of the vibration device caused by the vibration of the vibration region 131.

Figure 2:
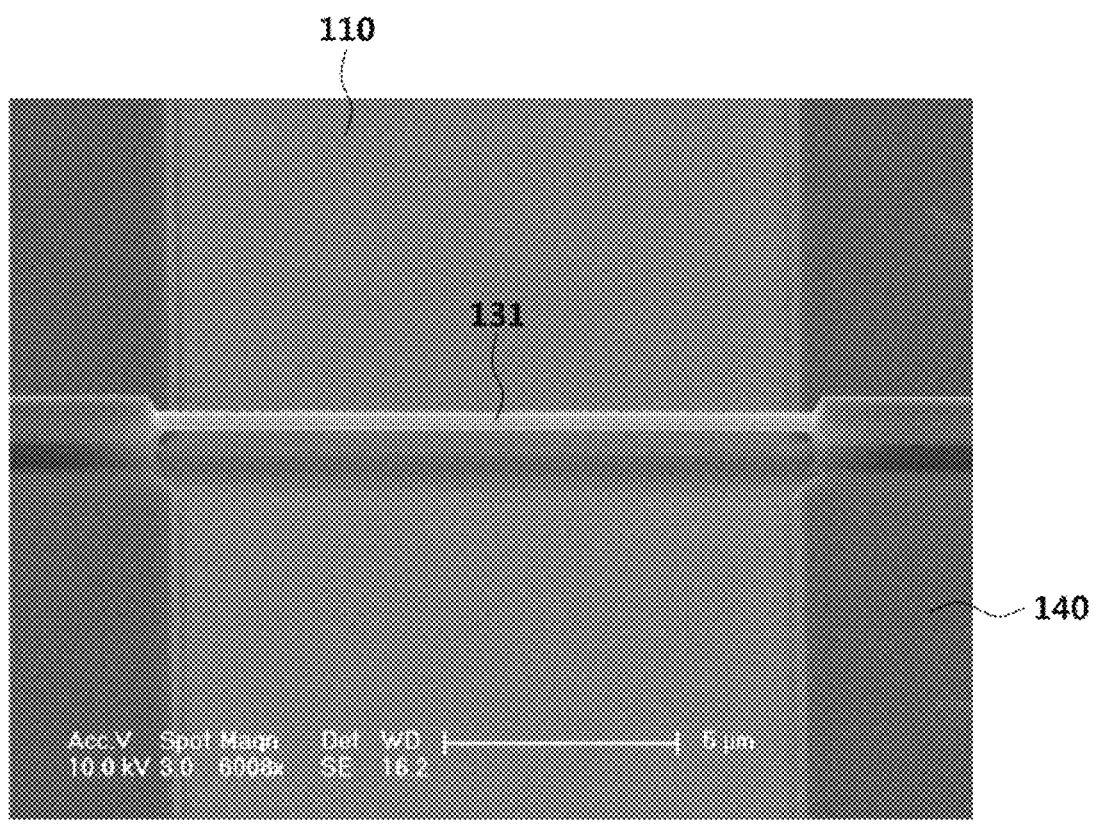
FIG. 2 illustrates a scanning electron microscope (SEM) picture obtained by capturing a vibration region in the vibration device of FIG. 1.

FIG. 2 illustrates a scanning electron microscope (SEM) picture obtained by capturing the vibration region 131 of FIG. 1.

As shown in FIG. 2, the vibration region 131 may be separated from the lower substrate 110 by a height of 1 micrometer ($\mu$m). The vibration region 131 may have a line width of 3 $\mu$m, a length of 10 $\mu$m, and a thickness of 100 nanometer (nm). Additionally, the ends of the vibration region 131 may be covered by the supporting portion 140.

Figure 3:
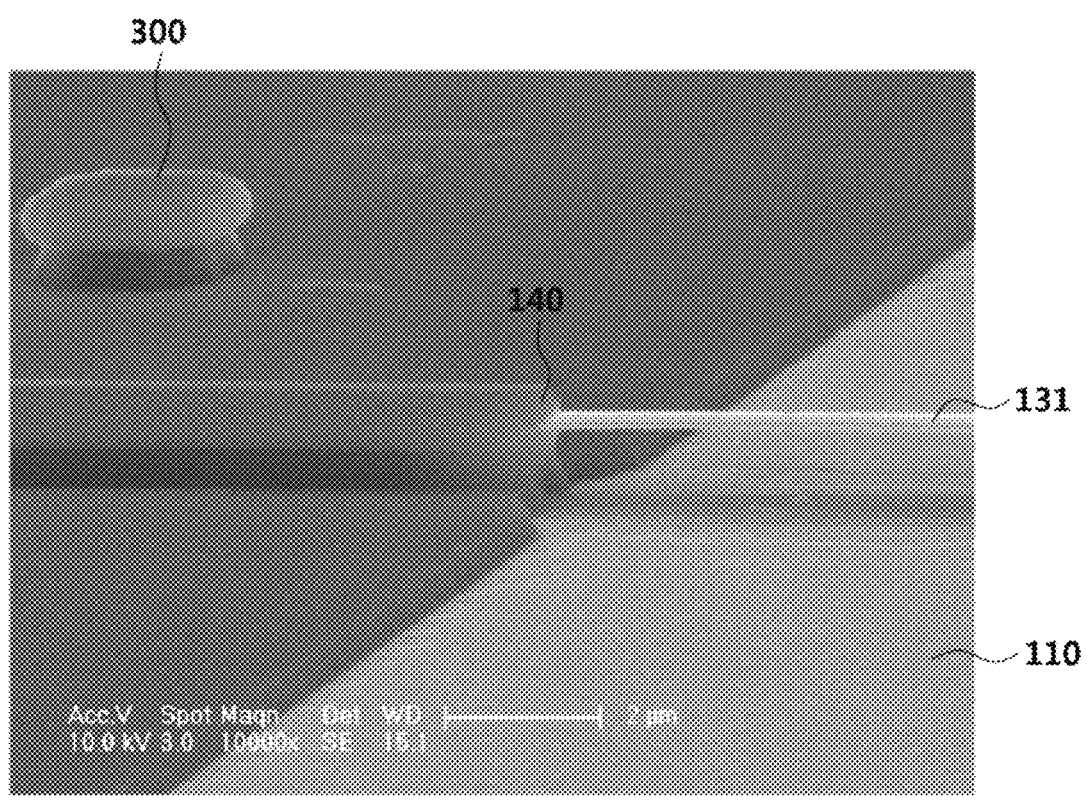
FIG. 3 illustrates a SEM picture obtained by capturing one end of the vibration region of FIG. 1.

FIG. 3 illustrates a SEM picture obtained by capturing one end of the vibration region 131 of FIG. 1.

As shown in FIG. 3, the end of the vibration region 131 may be covered by the supporting portion 140. The supporting portion 140 may also cover a portion of the insulating layer 120 that is connected to the bottom of the upper substrate 130 adjacent to the end of the vibration region 131. Accordingly, it is possible to prevent a structure of the vibration region 131 from being deformed by etching the portion of the insulating layer 120 connected to the bottom of the upper substrate 130, during etching of a portion of the insulating layer 120 connected to the bottom of the vibration region 131 to separate the vibration region 131 from the lower substrate 110.

Additionally, referring to FIG. 3, a microstructure 300 may be formed on the lower substrate 110. The microstructure 300 may inhibit heat transfer, and may increase fastening force between the supporting portion 140 and the lower substrate 110.

Figure 4:
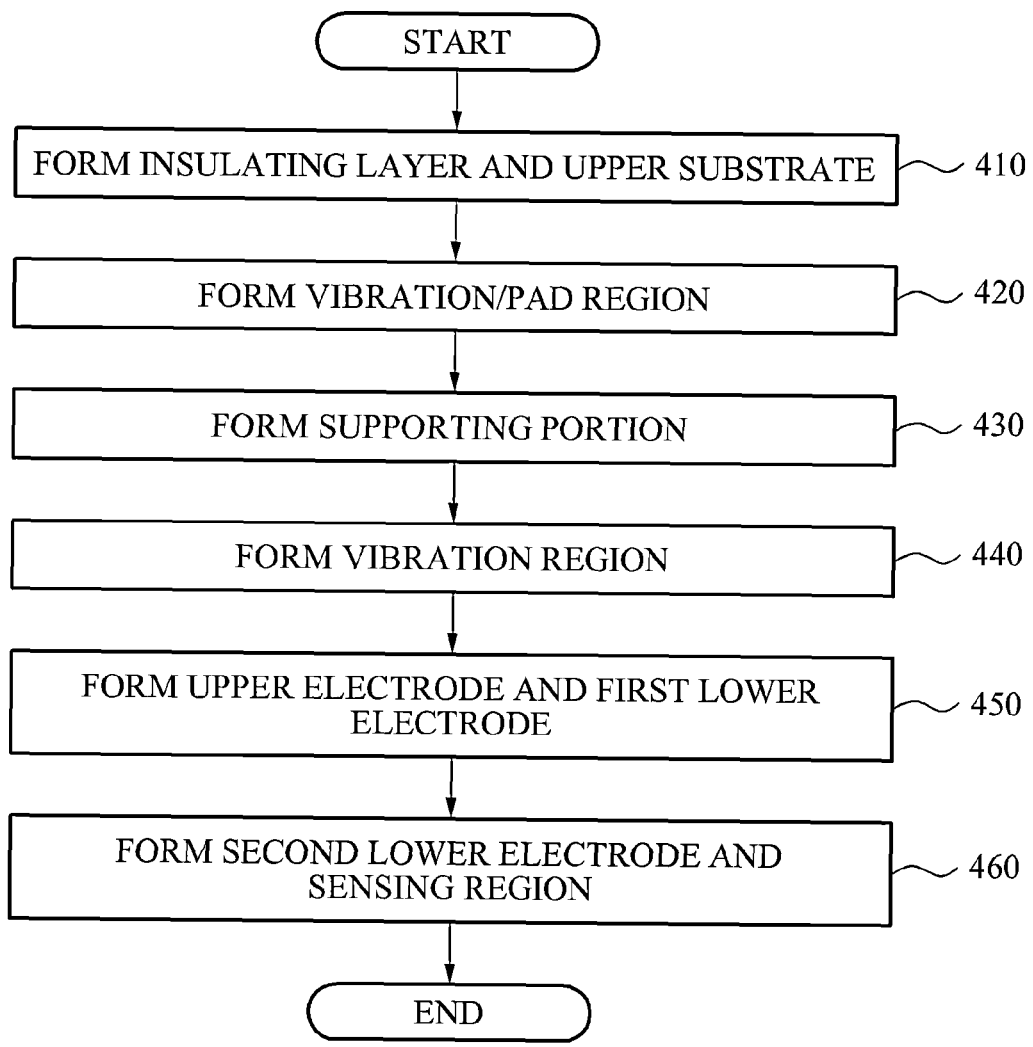
FIG. 4 is a flowchart of a method of manufacturing a vibration device according to an embodiment of the present invention.

FIG. 4 is a flowchart of a method of manufacturing a vibration device according to an embodiment of the present invention.

Referring to FIG. 4, in operation 410, a vibration device manufacturing apparatus may form the insulating layer 120 on the lower substrate 110, and may form the upper substrate 130 on the insulating layer 120.

Figure 5:
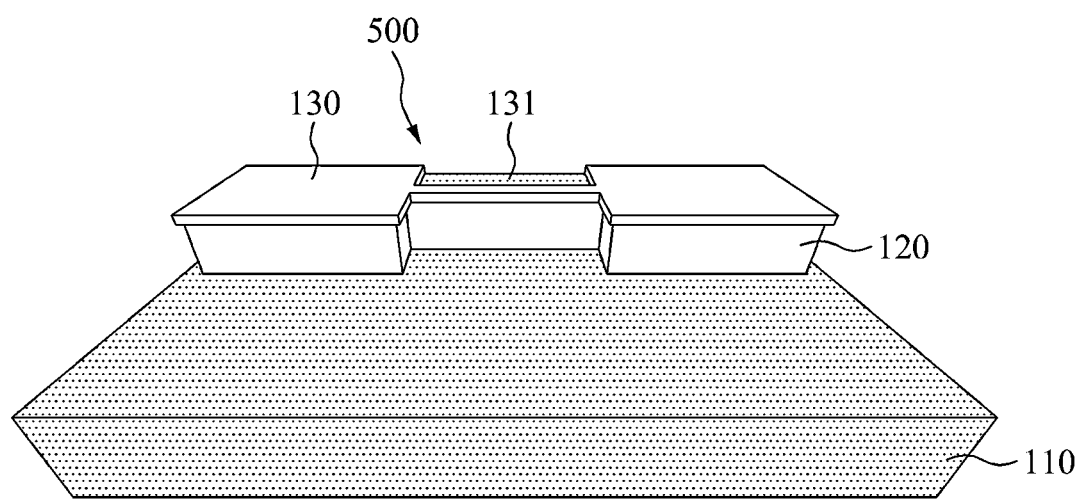
FIG. 5 illustrates an example of a vibration and pad (vibration/pad) region formed using the vibration method of FIG. 4.

In operation 420, the vibration device manufacturing apparatus may form a vibration and pad (vibration/pad) region by performing photolithography and etching on the insulating layer 120 and the upper substrate 130 formed in operation 410. The vibration/pad region may have a shape in which a front side and a rear side of a region that is set to be the vibration region 131 are etched, as shown in FIG. 5.

In operation 420, the vibration device manufacturing apparatus may additionally etch a portion of the insulating layer 120. For example, the vibration device manufacturing apparatus may additionally etch a portion of the insulating layer 120 that is adjacent to the bottom of each of both ends of the region set to be the vibration region 131 in the vibration/pad region.

When a material forming the supporting portion 140 is identical to a material forming the upper substrate 130, the vibration device manufacturing apparatus may apply a protection material onto the upper substrate 130. The protection material may be used to protect the upper substrate 130 from etching in formation of the supporting portion 140. For example, the vibration device manufacturing apparatus may form, using an oxidation process, an oxide film used to protect the upper substrate 130.

Additionally, the vibration device manufacturing apparatus may perform an ion implantation and diffusion process on a portion of the vibration/pad region on which the upper electrode 150 is to be formed.

In operation 430, the vibration device manufacturing apparatus may deposit a material layer forming the supporting portion 140 on the lower substrate 110 and on the vibration/pad region formed in operation 420. Additionally, the vibration device manufacturing apparatus may perform the photolithography and etching on the deposited material layer, and may form the supporting portion 140.

For example, when the vibration device manufacturing apparatus additionally etches a portion of the insulating layer 120 in operation 420, a material layer may be deposited on the etched portion, and the supporting portion 140 may be formed to cover a side of the insulating layer 120. In other words, the vibration device manufacturing apparatus may form the supporting portion 140 to cover a portion of the insulating layer 120 connected to the bottom of the ends of the vibration region 131, by additionally etching a portion of the insulating layer 120 in operation 420.

In another example, the vibration device manufacturing apparatus may control a time required to additionally etch a portion of the insulating layer 120 in operation 420, and may form the supporting portion 140 to partially or completely cover a portion of the insulating layer 120 connected to the bottom of the ends of the vibration region 131.

Figure 6:
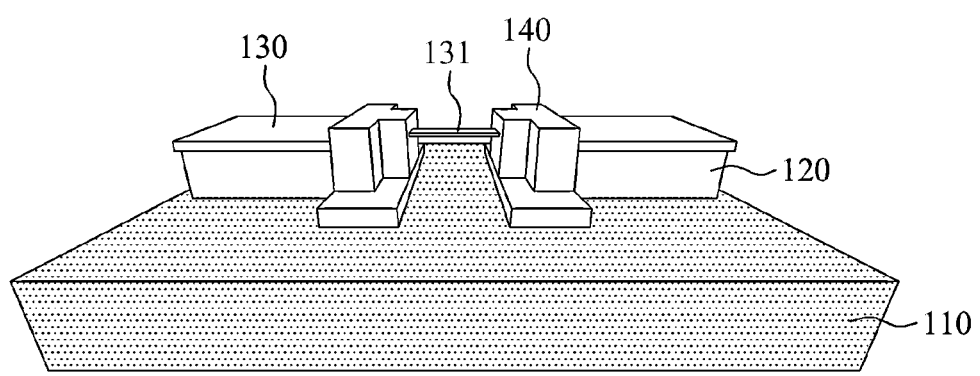
FIG. 6 illustrates an example of a supporting portion formed using the vibration method of FIG. 4.

In operation 440, the vibration device manufacturing apparatus may form the vibration region 131 by etching a portion of insulating layer 120 connected to the bottom of the region set to be the vibration region 131 in the vibration/pad region. When the portion of insulating layer 120 is etched, the vibration region 131 may be separated from the lower substrate 110, as shown in FIG. 6.

Figure 7:
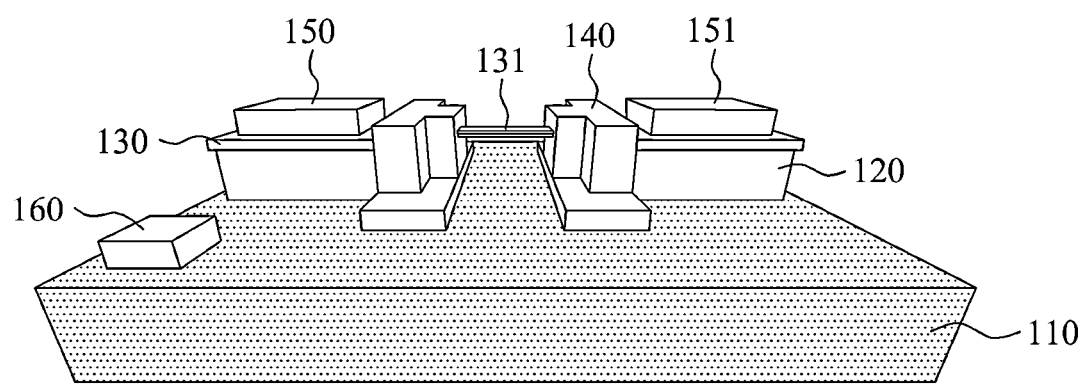
FIG. 7 illustrates an example of electrodes formed using the vibration method of FIG. 4.

In operation 450, the vibration device manufacturing apparatus may form the upper electrode 150 on the upper substrate 130, and may form the first lower electrode 160 on the lower substrate 110, as shown in FIG. 7. For example, the vibration device manufacturing apparatus may form the upper electrode 150 in the portion of the vibration/pad region on which the ion implantation and diffusion process is performed in operation 420.

Figure 8:
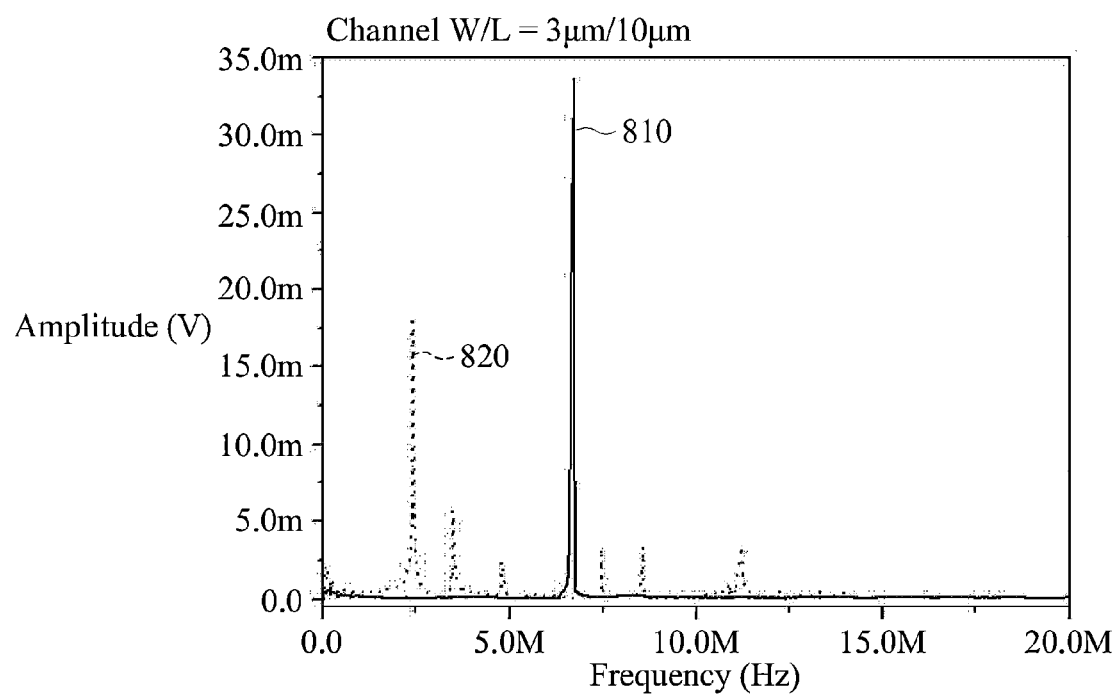
FIG. 8 illustrates an example of a vibration characteristic of the vibration device of FIG. 1.

In operation 460, the vibration device manufacturing apparatus may form the second lower electrode 161 on the bottom of the lower substrate 110, as shown in FIG. 8. Additionally, the vibration device manufacturing apparatus may form the sensing region 132 on the vibration region 131. The vibration device manufacturing apparatus may form an ohmic contact between the upper electrode 150, the first lower electrode 160, and the second lower electrode 161 through a metal heat treatment, and may manufacture the vibration device.

FIG. 5 illustrates an example of a vibration/pad region formed using the method of FIG. 4.

As shown in FIG. 5, the vibration device manufacturing apparatus may form a vibration/pad region 500 by etching a front side and a rear side of a region that is set to be the vibration region 131.

FIG. 6 illustrates an example of a supporting portion formed using the method of FIG. 4.

The vibration device manufacturing apparatus may deposit a material layer used to form the supporting portion 140 on the vibration/pad region 500 of FIG. 5, may perform a photolithography and etching on the deposited material layer, and may form the supporting portion 140.

Additionally, the vibration device manufacturing apparatus may etch a portion of the insulating layer 120 connected to the bottom of the region set to be the vibration region 131 in the vibration/pad region 500, so that the vibration region 131 may be separated from the lower substrate 110, as shown in FIG. 6. The supporting portion 140 may cover the ends of the vibration region 131, and may also cover a side of the insulating layer 120 connected to the bottom of each of the ends of the vibration region 131.

FIG. 7 illustrates an example of electrodes formed using the method of FIG. 4.

As shown in FIG. 7, the vibration device manufacturing apparatus may form the upper electrode 150 on the upper substrate 130, and may form the first lower electrode 160 on the lower substrate 110. For example, the vibration device manufacturing apparatus may form the upper electrode 150 the portion of the vibration/pad region on which the ion implantation and diffusion process is performed in operation 420.

Additionally, as shown in FIG. 1, the vibration device manufacturing apparatus may form the second lower electrode 161 on the bottom of the lower substrate 110. Additionally, the vibration device manufacturing apparatus may form the sensing region 132 on the vibration region 131. The vibration device manufacturing apparatus may form an ohmic contact between the upper electrode 150, the first lower electrode 160, and the second lower electrode 161 through a metal heat treatment, and may manufacture the vibration device.

FIG. 8 illustrates an example of a vibration characteristic of the vibration device of FIG. 1.

FIG. 8 illustrates a result 810 obtained by measuring a resonant frequency of a vibration signal output from the vibration device including the vibration region 131 having a width of 3 µm, a length of 10 µm and a thickness of 100 nm.

Referring to FIG. 8, the result 810 indicates that a single resonant frequency is measured at a frequency of 6.6 megahertz (MHz). On the other hand, a result 820 obtained by measuring a resonant frequency of a vibration signal output from a conventional vibration device that does not include a supporting portion indicates that a plurality of resonant frequencies are measured.

Additionally, the vibration region 131 may be separated from the lower substrate 110 in the vibration device of FIG. 1 and accordingly, a resonant frequency of a first mode may be lower than a theoretical value.

Figure 9:
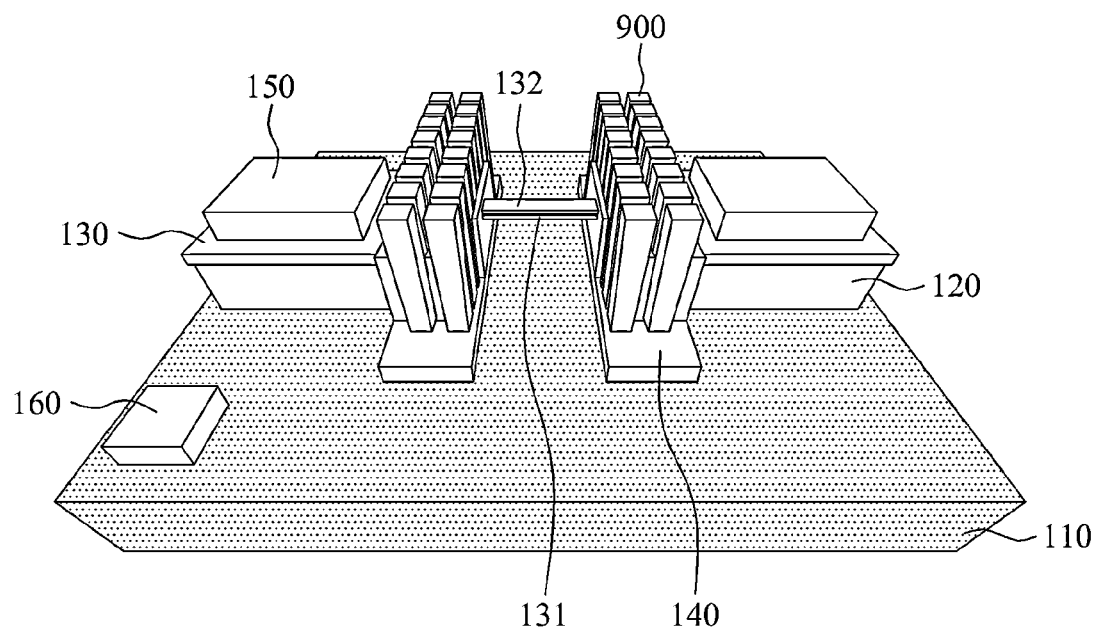
FIG. 9 illustrates another example of a vibration device according to an embodiment of the present invention.

FIG. 9 illustrates another example of a vibration device according to an embodiment of the present invention.

The vibration device of FIG. 9 may include a lower substrate 110, an insulating layer 120, an upper substrate 130, a supporting portion 140, an upper electrode 150, a first lower electrode 160, and radiation fins 900. The vibration device of FIG. 9 may further include a second lower electrode 161, although not shown in FIG. 9, similarly to the vibration device of FIG. 1.

The insulating layer 120 may be formed on the lower substrate 110. The insulating layer 120 may be formed of an insulating material, and may electrically separate the lower substrate 110 from the upper substrate 130.

The upper substrate 130 may be connected onto the insulating layer 120. Additionally, the upper substrate 130 may include a vibration region 131 that is separated from the lower substrate 110 by at least a predetermined distance and that vibrates. The vibration region 131 may vibrate in response to external vibration, or an AC signal output from one of the upper electrode 150, the first lower electrode 160, and the second lower electrode 161. Additionally, the vibration region 131 may include a sensing region 132 to sense external vibration, or an AC signal output from one of the upper electrode 150, the first lower electrode 160, and the second lower electrode 161.

The supporting portion 140 may be formed to cover both ends of the vibration region 131, and may support the vibration region 131. The supporting portion 140 may cover the vibration region 131, and a region of the upper substrate 130 that is adjacent to the ends of the vibration region 131, and may prevent deformation of the insulating layer 120, the upper substrate 130, and the vibration region 131 during manufacturing of the vibration device. Additionally, by preventing the deformation of the insulating layer 120, the upper substrate 130, and the vibration region 131, the supporting portion 140 may minimize a distortion and loss of a vibration signal generated by the vibration of the vibration region 131. The supporting portion 140 may have, for example, a shape of an anchor. Additionally, the supporting portion 140 may be formed of a material determined based on a material forming the upper substrate 130 and a material forming the insulating layer 120. For example, when a material forming the supporting portion 140 is identical to a material forming the upper substrate 130, a protection material may be applied onto the upper substrate 130. In this example, the protection material may be used to protect the upper substrate 130 from etching in formation of the supporting portion 140.

The upper electrode 150 may be formed on the upper substrate 130, and may control the vibration of the vibration region 131 by outputting an AC signal to the sensing region 132. The first lower electrode 160 may be formed on the lower substrate 110, and may control the vibration of the vibration region 131 by outputting an AC signal to the sensing region 132. The second lower electrode 161 may be formed on the bottom of the lower substrate 110, and may control the vibration of the vibration region 131 by outputting an AC signal to the sensing region 132.

The radiation fins 1000 may be formed on the supporting portion 140, and may have a shape of a plurality of square columns, as shown in FIG. 9. The radiation fins 1000 may radiate heat generated in the upper substrate 130 and the lower substrate 110. The radiation fins 1000 may have one of shapes satisfying a condition in which heat is radiated by increasing a contact area between air and the radiation fins 1000. For example, the radiation fins 1000 may be shaped as a plurality of plates that are arranged or connected to each other, in addition to the plurality of square columns of FIG. 9.

The vibration device of FIG. 9 may allow the heat generated in the upper substrate 130 and the lower substrate 110 to be radiated using the radiation fins 1000 and accordingly, it is possible to suppress thermal noise generated by transferring the heat to the vibration region 131.

Figure 10:
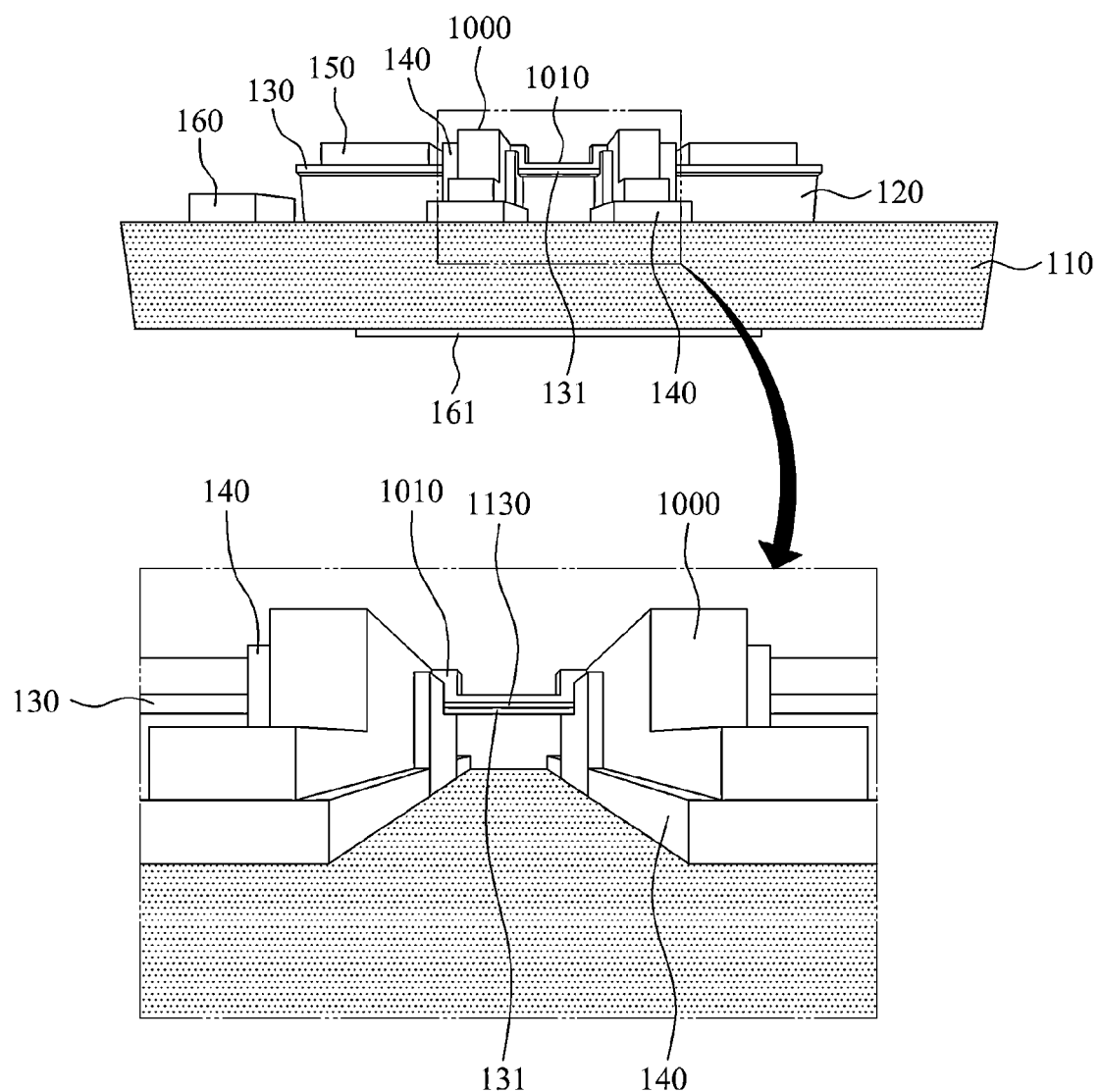
FIG. 10 illustrates still another example of a vibration device according to an embodiment of the present invention.

FIG. 10 illustrates still another example of a vibration device according to an embodiment of the present invention.

The vibration device of FIG. 10 may include a lower substrate 110, an insulating layer 120, an upper substrate 130, a supporting portion 140, an upper electrode 150, a first lower electrode 160, a second lower electrode 161, and additional electrodes 1000 and 1010.

The lower substrate 110 may include a circuit to connect the first lower electrode 160 and the second lower electrode 161, and a circuit to connect the first lower electrode 160 and the second lower electrode 161 to the sensing region 132.

The insulating layer 120 may be formed on the lower substrate 110. The insulating layer 120 may be formed of an insulating material, and may electrically separate the lower substrate 110 from the upper substrate 130.

The upper substrate 130 may be connected onto the insulating layer 120. Additionally, the upper substrate 130 may include a vibration region 131 that is separated from the lower substrate 110 by at least a predetermined distance and that vibrates. The vibration region 131 may vibrate in response to external vibration, or an AC signal output from one of the upper electrode 150, the first lower electrode 160, and the second lower electrode 161. Additionally, the vibration region 131 may include a sensing region to sense external vibration, or an AC signal output from one of the upper electrode 150, the first lower electrode 160, and the second lower electrode 161. The upper substrate 130 may include a circuit to connect the upper electrode 150 and the sensing region 132.

The supporting portion 140 may be formed to cover both ends of the vibration region 131, and may support the vibration region 131. The supporting portion 140 may cover the vibration region 131, and a region of the upper substrate 130 that is adjacent to the ends of the vibration region 131, and may prevent deformation of the insulating layer 120, the upper substrate 130, and the vibration region 131 during manufacturing of the vibration device. Additionally, by preventing the deformation of the insulating layer 120, the upper substrate 130, and the vibration region 131, the supporting portion 140 may minimize a distortion and loss of a vibration signal generated by the vibration of the vibration region 131. The supporting portion 140 may have, for example, a shape of an anchor. Additionally, the supporting portion 140 may be formed of a material determined based on a material forming the upper substrate 130 and a material forming the insulating layer 120. For example, when a material forming the supporting portion 140 is identical to a material forming the upper substrate 130, a protection material may be applied onto the upper substrate 130. In this example, the protection material may be used to protect the upper substrate 130 from etching in formation of the supporting portion 140.

The upper electrode 150 may be formed on the upper substrate 130, and may control the vibration of the vibration region 131 by outputting an AC signal to the sensing region 132. The first lower electrode 160 may be formed on the lower substrate 110, and may control the vibration of the vibration region 131 by outputting an AC signal to the sensing region 132. The second lower electrode 161 may be formed on the bottom of the lower substrate 110, and may control the vibration of the vibration region 131 by outputting an AC signal to the sensing region 132.

The additional electrode 1010 may be formed above the vibration region 131, and the additional electrode 1000 may be formed on the supporting portion 140. Each of the additional electrodes 1000 and 1010 may output an AC signal to the vibration region 131. The additional electrode 1000 may be formed by depositing an electrode material on the supporting portion 140. The vibration region 131 may vibrate in response to an AC signal applied to the additional electrode 1000 and the upper electrode 150. For example, when a gap is formed in a middle portion of the additional electrode 1000 formed on the supporting portion 140, a vibration form of the vibration region 131 may be changed.

Additionally, a vibration device manufacturing apparatus may form an additional insulating layer 1130 on the vibration region 131, and may form the additional electrode 1010 on the additional insulating layer 1130, which may allow the additional electrode 1010 to independently operate. For example, when a predetermined region of the additional electrode 1010 is removed, conductivity of the additional insulating layer 1130 may be changed, and a change in the conductivity may be sensed. In this example, the conductivity of the additional insulating layer 1130 may be changed based on an external stimulus, and the additional insulating layer 1130 may be formed of a material enabling the vibration region 131 and the additional electrode 1010 to be electrically separated from each other.

The additional electrode 1000 or the upper electrode 150 may be connected, through the supporting portion 140, to the lower substrate 110, or to another circuit included in the upper substrate 130 and connected to the vibration region 131. In other words, the supporting portion 140 may connect the circuit in the upper substrate 130 to the circuit in the lower substrate 110 and thus, it is possible to facilitate integration of circuits in the vibration device.

As described above, according to embodiments of the present invention, a supporting portion may be formed to cover both ends of a vibration region, and formed of a material having a selectivity different from a selectivity of a material forming an insulating layer and thus, it is possible to prevent the insulating layer from being unnecessarily etched during formation of the vibration region. Additionally, the supporting portion may be formed to cover both the ends of the vibration region, and physical fixing force of the vibration region may be increased and thus, it is possible to minimize torsion of a vibration device caused by vibration of the vibration region.

Furthermore, heat generated in an upper substrate and a lower substrate may be radiated using radiation fins and thus, it is possible to suppress thermal noise generated by transferring the heat to a vibration region.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A vibration device, comprising:
   a lower substrate on which an insulating layer is formed;
   an upper substrate connected onto the insulating layer, and comprising a vibration region that vibrates and that is separated from the lower substrate by at least a predetermined distance; and
   a supporting portion formed to cover both ends of the vibration region and to support the vibration region,
   wherein the insulating layer is divided into a first insulating layer part on a first side of the vibration region and a second insulating layer part on a second opposing side of the vibration region, each of the first and second insulating layer parts having a side that faces the vibration region, and
   wherein the supporting portion covers the sides of the first and second insulating layer parts that face the vibration region.

2. The vibration device of claim 1, wherein the supporting portion is formed of a material determined based on a material forming the upper substrate and a material forming the insulating layer.

3. The vibration device of claim 1, wherein radiation fins are formed on the supporting portion, and radiate heat generated in the upper substrate and the lower substrate.

4. The vibration device of claim 1, further comprising:
   additional electrodes formed above the vibration region and on the supporting portion, to output a signal to the vibration region.

5. The vibration device of claim 1, further comprising:
   a lower electrode formed on the top or the bottom of the lower substrate, to output a signal to the vibration region; and
   an upper electrode formed on the upper substrate, to output a signal to the vibration region.

6. The vibration device of claim 5, wherein the lower substrate comprises a circuit connected from the lower electrode to the vibration region, and
   wherein the upper electrode is connected to the circuit through the supporting portion.

7. The vibration device of claim 5, wherein the vibration region vibrates in response to a signal output from the lower electrode or the upper electrode.

8. The vibration device of claim 1, wherein the vibration region is separated from the lower substrate by at least the predetermined distance, by etching a portion of the insulating layer connected to the bottom of the vibration region.

9. The vibration device of claim 1, wherein the supporting portion fills a space between the vibration region and an upper surface of the lower substrate.

10. The vibration device of claim 1, wherein the vibration region includes a portion of the upper substrate that spans a space between first and second parts of the supporting portion.

11. The vibration device of claim 10, wherein ends of the portion of the upper substrate that spans the space are covered by the supporting portion.

12. A vibration device, comprising:
   a lower substrate on which an insulating layer is formed;
   an upper substrate connected onto the insulating layer, and comprising a vibration region that vibrates and that is separated from the lower substrate by at least a predetermined distance;
   a supporting portion formed to cover both ends of the vibration region and to support the vibration region; and
   radiation fins formed on the supporting portion, to radiate heat generated in the upper substrate and the lower substrate,
   wherein the insulating layer is divided into a first insulating layer part on a first side of the vibration region and a second insulating layer part on a second opposing side of the vibration region, each of the first and second insulating layer parts having a side that faces the vibration region, and
   wherein the supporting portion covers the sides of the first and second insulating layer parts that face the vibration region.

13. The vibration device of claim 12, further comprising:
   additional electrodes formed above the vibration region and on the supporting portion, to output a signal to the vibration region.

14. A vibration device, comprising:
   a lower substrate on which an insulating layer is formed;
   an upper substrate connected onto the insulating layer, and comprising a vibration region that vibrates and that is separated from the lower substrate by at least a predetermined distance;
   a supporting portion formed to cover both ends of the vibration region and to support the vibration region; and
   electrodes formed above the vibration region and on the supporting portion, to output a signal to the vibration region,
   wherein the insulating layer is divided into a first insulating layer part on a first side of the vibration region and a second insulating layer part on a second opposing side of the vibration region, each of the first and second insulating layer parts having a side that faces the vibration region, and wherein the supporting portion covers the sides of the first and second insulating layer parts that face the vibration region.

15. The vibration device of claim 14, wherein the vibration region vibrates in response to an alternating current (AC) signal output from the electrodes, and outputs a vibration signal having a resonant frequency.

16. The vibration device of claim 15, wherein the resonant frequency is determined based on a width, a length and a height of a portion of the vibration region that is not covered by the supporting portion.

* * * * *